United States Patent
Kim et al.

(10) Patent No.: US 10,591,958 B2
(45) Date of Patent: Mar. 17, 2020

(54) ROLLABLE DISPLAY DEVICE

(71) Applicant: Samsung Display Co., Ltd., Yongin-si (KR)

(72) Inventors: Tae Woong Kim, Seongnam-si (KR); Khachatryan Hayk, Hwaseong-si (KR); Hyun Woo Koo, Hwaseong-si (KR); Min-Sung Kim, Hwaseong-si (KR); Jeong Ho Kim, Seoul (KR); Jin Hwan Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/145,169

(22) Filed: Sep. 28, 2018

(65) Prior Publication Data

US 2019/0250668 A1    Aug. 15, 2019

(30) Foreign Application Priority Data

Feb. 13, 2018  (KR) .................. 10-2018-0017886

(51) Int. Cl.
*H05K 1/00* (2006.01)
*G06F 1/16* (2006.01)
*G09F 9/30* (2006.01)
*H01L 51/00* (2006.01)

(52) U.S. Cl.
CPC ............ *G06F 1/1652* (2013.01); *G09F 9/301* (2013.01); *H01L 51/0097* (2013.01)

(58) Field of Classification Search
CPC ..... G06F 1/1652; G09F 9/301; H01L 51/0097

USPC ........................................................ 361/749
See application file for complete search history.

(56) References Cited

U.S. PATENT DOCUMENTS

| | | | |
|---|---|---|---|
| 9,722,195 B2 | 8/2017 | Kim et al. | |
| 2009/0244456 A1* | 10/2009 | Miyazaki | G02F 1/133305 349/122 |
| 2010/0264817 A1* | 10/2010 | Bouten | G02F 1/133305 313/512 |
| 2011/0261290 A1* | 10/2011 | Kim | G02B 6/0021 349/64 |
| 2015/0041769 A1* | 2/2015 | Kim | H01L 51/0097 257/40 |
| 2016/0226024 A1* | 8/2016 | Park | H01L 51/5256 |
| 2016/0320803 A1* | 11/2016 | Oh | G06F 1/1652 |
| 2017/0367198 A1* | 12/2017 | Park | H01L 51/5237 |
| 2018/0342566 A1* | 11/2018 | Khachatryan | H05K 5/0017 |
| 2018/0371196 A1* | 12/2018 | Park | C08L 33/12 |
| 2019/0165314 A1* | 5/2019 | Kim | H01L 51/5253 |

FOREIGN PATENT DOCUMENTS

| | | |
|---|---|---|
| KR | 10-2015-0085352 | 7/2015 |
| KR | 10-2016-0130074 | 11/2016 |
| KR | 10-2017-0068823 | 6/2017 |

\* cited by examiner

*Primary Examiner* — Yuriy Semenenko
(74) *Attorney, Agent, or Firm* — H.C. Park & Associates, PLC (57) ABSTRACT

An exemplary embodiment provides a rollable display device including: a rollable display panel including a front surface and a rear surface, a first damping layer positioned on the front surface of the rollable display panel, and a second damping layer positioned on the rear surface of the rollable display panel. The first damping layer and the second damping layer have a shear thickening characteristic.

19 Claims, 11 Drawing Sheets

| First and second damping layers | Properties |
|---|---|
| Thickness (μm) | 5 ~ 300 |
| Young's modulus (E), MPa | 10 ~ 100 |
| Yield point, MPa | 10 ~ 100 |
| Yield Strain, % | 100 ~ 1000 |
| Elongation, % | 100 ~ 1000 |

FIG. 4B

| First and second high-strength layers | Properties |
|---|---|
| Thickness (μm) | 10 ~ 50 |
| Young's modulus (E), GPa | 1 ~ 100 |
| Yield point, GPa | 50 ~ 500 |
| Yield Strain, % | 1 ~ 10 |
| Elongation, % | 10 ~ 100 |

ROLLABLE DISPLAY DEVICE

CROSS-REFERENCE TO RELATED APPLICATION

This application claims priority from and the benefit of Korean Patent Application No. 10-2018-0017886, filed on Feb. 13, 2018, which is hereby incorporated by reference for all purposes as if fully set forth herein.

BACKGROUND

Field

Exemplary embodiments of the invention relate to a display device.

Discussion of the Background

Generally, as examples of display devices, there are an organic light emitting diode (OLED) display, a liquid crystal display (LCD), and a plasma display panel (PDP).

Among them, the organic light emitting diode display includes a substrate and an organic light emitting element.

In recent years, a rollable organic light emitting diode display, which is a rollable display device including a flexible substrate, has been used. However, rollable organic light emitting diode displays are susceptible to breakage from external impacts.

The above information disclosed in this Background section is only for understanding of the background of the inventive concepts, and, therefore, it may contain information that does not constitute prior art.

SUMMARY

Rollable display devices constructed according to exemplary embodiments of the invention are capable of suppressing breakage due to external impacts.

Additional features of the inventive concepts will be set forth in the description which follows, and in part will be apparent from the description, or may be learned by practice of the inventive concepts.

An exemplary embodiment provides a rollable display device including a rollable display panel including a front surface and a rear surface, a first damping layer positioned on the front surface of the rollable display panel, and a second damping layer positioned on the rear surface of the rollable display panel. The first damping layer and the second damping layer have a shear thickening characteristic.

The rollable display device may further include a first high-strength layer positioned between the rollable display panel and the first damping layer to have a greater Young's modulus as compared with the first damping layer.

The rollable display device may further include a second high-strength layer positioned between the rollable display panel and the second damping layer to have a greater Young's modulus as compared with the second damping layer.

The first damping layer and the second damping layer may have a Young's modulus of 10 MPa to 100 MPa.

The first high-strength layer and the second high-strength layer may have a Young's modulus of 1 GPa to 100 GPa.

The first damping layer may be thicker than the first high-strength layer, and the second damping layer may be thicker than the second high-strength layer.

Thicknesses of the first damping layer and the second damping layer may be in a range of 5 μm to 300 μm.

Thicknesses of the first high-strength layer and the second high-strength layer may be in a range of 10 μm to 50 μm.

The first high-strength layer and the second high-strength layer may have a shear thinning characteristic.

The first high-strength layer and the second high-strength layer may include polyimide.

The rollable display device may further include: a first adhesive layer positioned between the rollable display panel and the first high-strength layer; and a second adhesive layer positioned between the rollable display panel and the second high-strength layer.

The first damping layer and the second damping layer may include an elastomer including at least one of thermoplastic urethane (TPU) and thermoplastic olefin (TPO).

The first damping layer may include: a first sub-damping layer positioned on the front surface of the rollable display panel; and a second sub-damping layer positioned on the first sub-damping layer.

The first sub-damping layer may be thicker than the second sub-damping layer.

A thickness of the first sub-damping layer may be identical to that of the second sub-damping layer.

The second sub-damping layer may be thicker than the first sub-damping layer.

The rollable display device may further include a hard coating layer positioned on the first damping layer.

The rollable display device may further include a black coating layer positioned on the second damping layer.

An exemplary embodiment of the present invention provides a rollable display device including a rollable display panel including a front surface and a rear surface, a first damping layer positioned on the front surface of the rollable display panel, a second damping layer positioned on the rear surface of the rollable display panel, and a first high-strength layer positioned between the rollable display panel and the first damping layer. A Young's modulus of the first high-strength layer is greater than that of the first damping layer.

The rollable display device may further include a second high-strength layer positioned between the rollable display panel and the second damping layer to have a greater Young's modulus as compared with the second damping layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments of the invention. As used herein "embodiments" and "implementations" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a rollable display device according to an exemplary embodiment will be described with reference to FIGS. 1, 2, 3, and 4.

Figure 1:
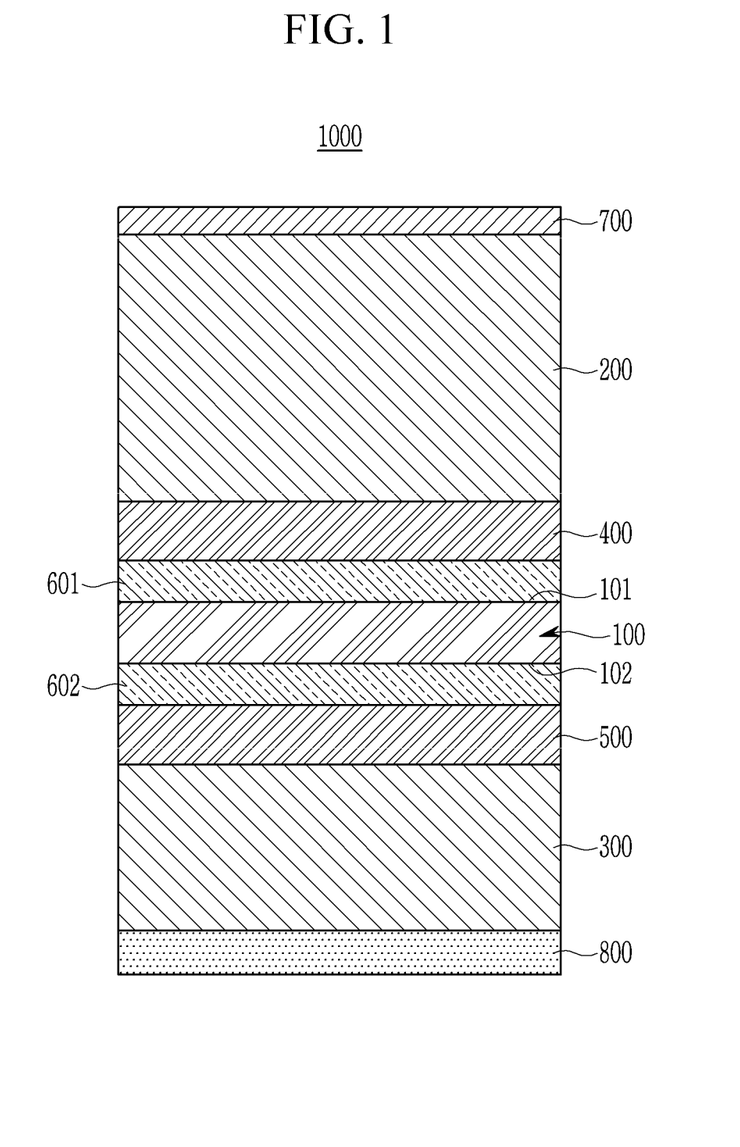
FIG. 1 is a cross-sectional view illustrating a part of a rollable display device according to an exemplary embodiment.

FIG. 1 is a cross-sectional view illustrating a part of a rollable display device according to an exemplary embodiment.

Referring to FIG. 1, the rollable display device 1000 according to the present exemplary embodiment is rollable. In another exemplary embodiment, the rollable display device 1000 is flexible, bendable, or stretchable.

The rollable display device 1000 includes a rollable display panel 100, a first damping layer 200, a second damping layer 300, a first high-strength layer 400, a second high-strength layer 500, a first adhesive layer 601, a second adhesive layer 602, a hard coating layer 700, and a black coating layer 800.

The rollable display panel 100 is rollable and displays an image. The rollable display panel 100 includes a flexible substrate and a display unit such as an organic light emitting element for displaying an image. The rollable display panel 100 may include a display unit including a liquid crystal. The rollable display panel 100 may include a flexible substrate which includes a polymer such as polyimide, polyethylene, or polypropylene, a driving circuit which includes a plurality of thin film transistors, an organic light emitting element, and an encapsulation layer which covers the organic light emitting element, but the present invention is not limited thereto.

The rollable display panel 100 includes a front surface 101 and a rear surface 102 positioned at an opposite side of the front surface 101. The rollable display panel 100 may display an image on the front surface 101.

The first adhesive layer 601, the first high-strength layer 400, the first damping layer 200, and the hard coating layer 700 are sequentially positioned on the front surface 101 of the rollable display panel 100.

The second adhesive layer 602, the second high-strength layer 500, the second damping layer 300, and the black coating layer 800 are sequentially positioned on the rear surface 102 of the rollable display panel 100.

The first damping layer 200 is positioned on the front surface 101 of the rollable display panel 100. When the first damping layer 200 is deformed due to stress, the first damping layer 200 has a shear thickening characteristic in which the Young's modulus rises as the shear rate rises.

The first damping layer 200 is positioned between the first high-strength layer 400 and the hard coating layer 700.

The first damping layer 200 has a Young's modulus level that is in a range of 10 MPa to 100 MPa, in a normal state in which no stress is applied.

The first damping layer 200 may be thicker than the first high-strength layer 400, and may have a thickness that is in a range of 5 μm to 300 μm.

The first damping layer 200 may include an elastomer including at least one of a thermoplastic urethane (TPU) and a thermoplastic olefin (TPO). However, the first damping layer 200 may include various elastomers having the shear thickening characteristic without being limited thereto.

A yield point of the first damping layer 200 may be in a range of 10 MPa to 100 MPa, a yield strain thereof may be in a range of 100% to 1000%, and elongation thereof may be in a range of 100% to 1000%.

The second damping layer 300 is positioned on the rear surface 102 of the rollable display panel 100. The second damping layer 300, which is deformed due to stress applied to the second damping layer 300, has a shear thickening characteristic in which the Young's modulus rises.

The second damping layer 300 is positioned between the second high-strength layer 500 and the black coating layer 800.

The second damping layer 300 has a Young's modulus level that is in a range of 10 MPa to 100 MPa, in a normal state in which no stress is applied.

The second damping layer 300 is thicker than the second high-strength layer 500, and may have a thickness that is in a range of 5 μm to 300 μm.

The second damping layer 300 may include an elastomer including at least one of a thermoplastic urethane (TPU) and a thermoplastic olefin (TPO). However, the first damping layer 200 may include various elastomers having the shear thickening characteristic without being limited thereto.

A yield point of the second damping layer 300 may be in a range of 10 MPa to 100 MPa, a yield strain thereof may be in a range of 100% to 1000%, and elongation thereof may be in a range of 100% to 1000%.

Figure 2:
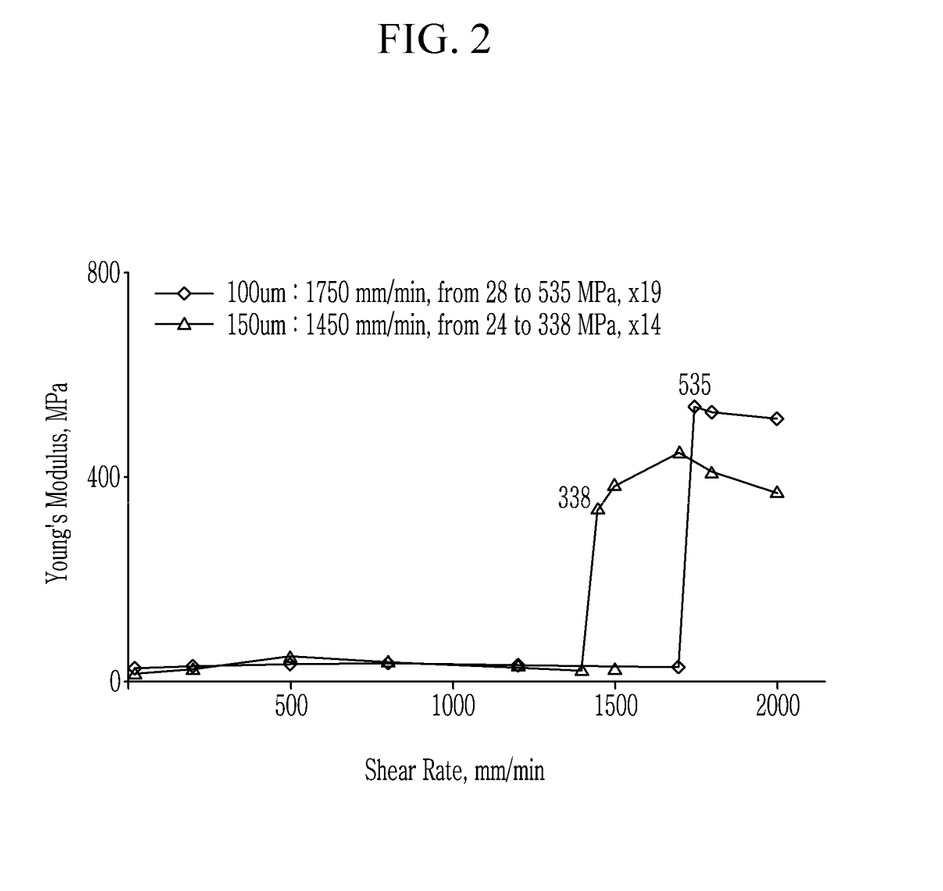
FIG. 2 is a graph illustrating shear thickening characteristics of a first damping layer and a second damping layer illustrated in FIG. 1.

FIG. 2 is a graph illustrating shear thickening characteristics of a first damping layer and a second damping layer illustrated in FIG. 1.

In FIG. 2, an x-axis indicates a shear rate, and a y-axis indicates the Young's modulus.

Referring to FIGS. 1 and 2, when having the thickness of 100 μm, the first damping layer 200 and the second damping layer 300 have a Young's modulus of 535 MPa which is increased by substantially 19 times based on a Young's modulus of 28 MPa at a shear rate of 1750 mm/min.

In addition, when having the thickness of 150 μm, the first damping layer 200 and the second damping layer 300 have a Young's modulus of 338 MPa which is increased by substantially 14 times based on a Young's modulus of 24 MPa at a shear rate of 1450 mm/min.

As such, the first damping layer 200 and the second damping layer 300 have shear thickening characteristics.

Referring to FIG. 1 again, the first high-strength layer 400 is positioned on the front surface 101 of the rollable display panel 100. The first high-strength layer 400, which is deformed due to stress applied to the first high-strength layer 400, has a shear thinning characteristic in which the Young's modulus falls when the shear rate increases (see FIG. 3).

The first high-strength layer 400 is positioned between the rollable display panel 100 and the first damping layer 200. Specifically, the first high-strength layer 400 is positioned between the first adhesive layer 601 and the first damping layer 200.

The first high-strength layer 400 has a greater Young's modulus than the first damping layer 200. The first high-strength layer 400 has a Young's modulus level that is in a range of 1 GPa to 100 GPa, in a normal state in which no stress is applied.

The first high-strength layer 400 is thinner than the first damping layer 200, and may have a thickness that is in a range of 10 μm to 50 μm.

The first high-strength layer 400 may include at least one of polyimide and polyethylene terephthalate (PET). However, the first high-strength layer 400 may include various polymers having the shear thinning characteristic without being limited thereto.

A yield point of the first high-strength layer 400 may be in a range of 50 GPa to 500 GPa, a yield strain thereof may be in a range of 1% to 10%, and elongation thereof may be in a range of 10% to 100%.

The second high-strength layer 500 is positioned on the rear surface 102 of the rollable display panel 100. When the second high-strength layer 500 is deformed due to stress, the second high-strength layer 500 has a shear thinning characteristic in which the Young's modulus falls when the shear rate increases.

The second high-strength layer 500 is positioned between the rollable display panel 100 and the second damping layer 300. Specifically the second high-strength layer 500 is positioned between the second adhesive layer 602 and the second damping layer 300.

The second high-strength layer 500 has a greater Young's modulus than the second damping layer 300. The second high-strength layer 500 has a Young's modulus level that is in a range of 1 GPa to 100 GPa, in a normal state in which no stress is applied.

The second high-strength layer 500 is thinner than the second damping layer 300, and may have a thickness that is in a range of 10 μm to 50 μm.

The second high-strength layer 500 may include at least one of polyimide and polyethylene terephthalate (PET). However, the second high-strength layer 500 may include various polymers having the shear thinning characteristic without being limited thereto.

A yield point of the second high-strength layer 500 may be in a range of 50 GPa to 500 GPa, a yield strain thereof may be in a range of 1% to 10%, and elongation thereof may be in a range of 10% to 100%.

Figure 3:
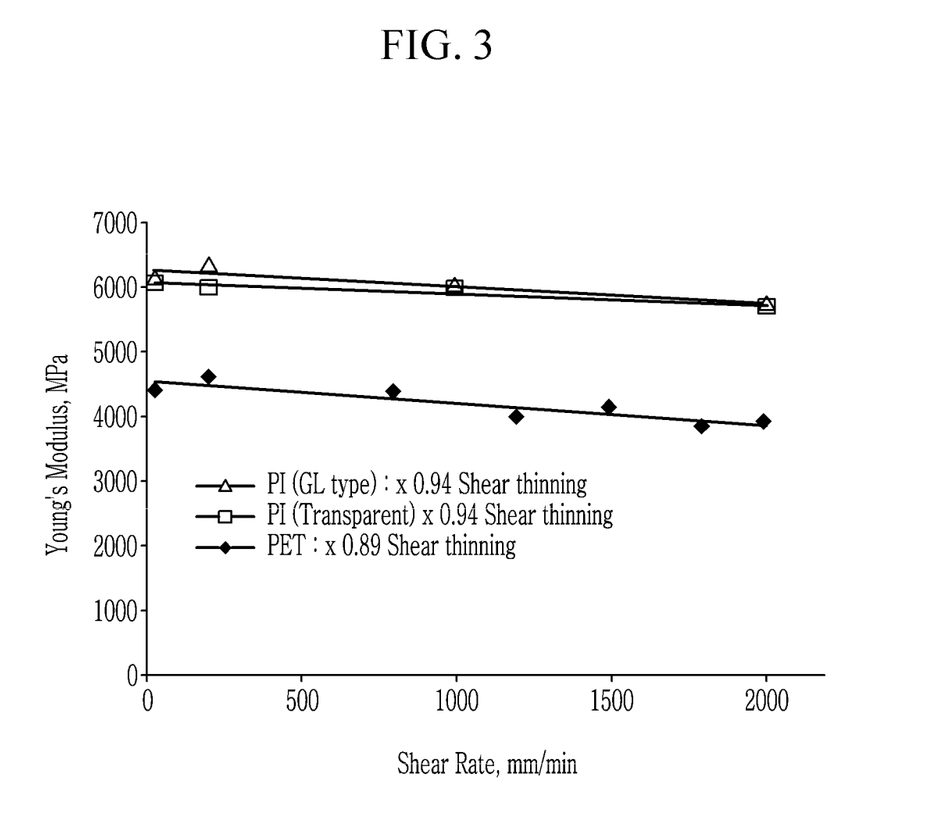
FIG. 3 is a graph illustrating shear thinning characteristics of a first high-strength layer and a second high-strength layer illustrated in FIG. 1.

FIG. 3 is a graph illustrating shear thinning characteristics of a first high-strength layer and a second high-strength layer illustrated in FIG. 1.

In FIG. 3, an x-axis indicates a shear rate, and a y-axis indicates the Young's modulus.

Referring to FIGS. 1 and 3, in the case that the first high-strength layer 400 and the second high-strength layer 500 contain a polyimide PI (GL type), a transparent polyimide PI (transparent), or polyethylene terephthalate PET having color, the Young's modulus decreases continuously as the shear rate increases.

For example, when the first high-strength layer 400 and second high-strength layer 500 contain the polyimide PI (GL type) or the transparent polyimide PI (transparent), the Young's modulus drops to a slope of substantially 0.94 as the shear rate increases.

In addition, when the first high-strength layer 400 and the second high-strength layer 500 contain polyethylene terephthalate PET, the Young's modulus drops to a slope of substantially 0.89 as the shear rate increases.

As such, the first high-strength layer and the second high-strength layer have a shear thinning characteristic.

Figure 4A:
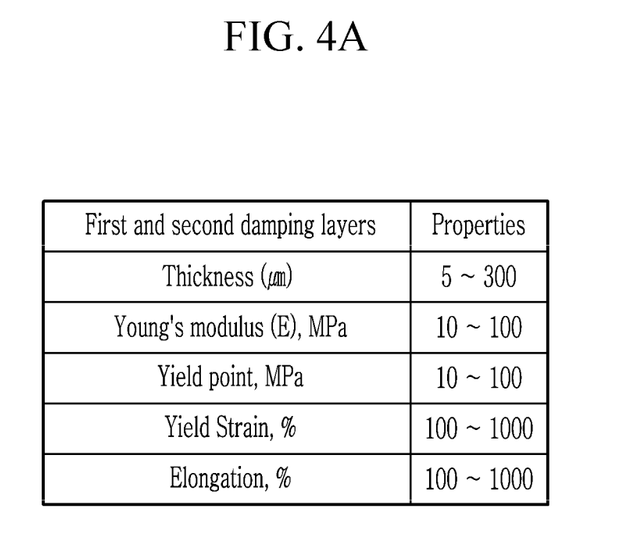
FIG. 4A is a table showing properties of the first damping layer and the second damping layer illustrated in FIG. 1.
Figure 4B:
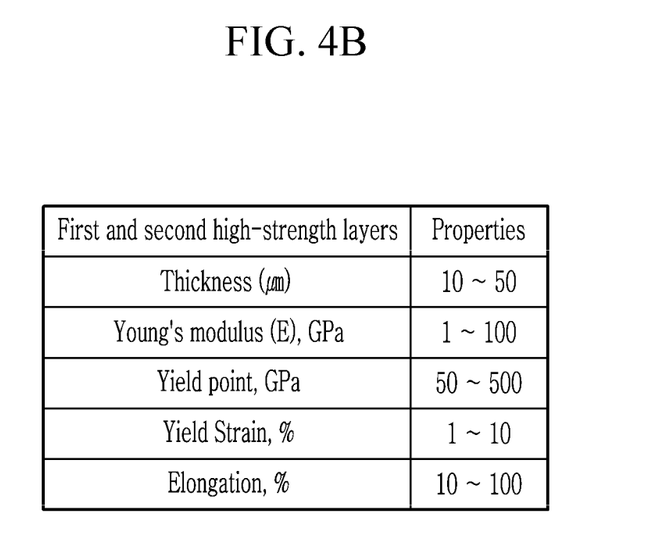
FIG. 4B is a table showing properties of the first high-strength layer and the second high-strength layer illustrated in FIG. 1.

FIG. 4A is a table showing properties of the first damping layer and the second damping layer illustrated in FIG. 1. FIG. 4B is a table showing properties of the first high-strength layer and the second high-strength layer illustrated in FIG. 1.

Referring to FIG. 4A, the first damping layer and the second damping layer have a thickness of 5 μm to 300 μm, a Young's modulus of 10 MPa to 100 MPa, a yield point of 10 MPa to 100 MPa, a yield strain of 100% to 1000%, and elongation of 100% to 1000%.

Referring to FIG. 4B, the first high-strength layer and the second high-strength layer have a thickness of 10 μm to 50 μm, a Young's modulus of 1 GPa to 100 GPa, a yield point of 50 GPa to 500 GPa, a yield strain of 1% to 10%, and elongation of 10% to 100%.

Referring to FIG. 1, the first adhesive layer 601 is positioned between the rollable display panel 100 and the first high-strength layer 400. The first adhesive layer 601 adheres the rollable display panel 100 and the first high-strength layer 400. The first adhesive layer 601 may include a transparent pressure-sensitive adhesive.

In another exemplary embodiment, the rollable display panel 100 and the first high-strength layer 400 may be directly adhered to each other without using the first adhesive layer 601.

The second adhesive layer 602 may be positioned between the rollable display panel 100 and the second high-strength layer 500. The second adhesive layer 602 adheres the rollable display panel 100 and the second high-strength layer 500. The second adhesive layer 602 may include a transparent pressure-sensitive adhesive.

In another exemplary embodiment, the rollable display panel 100 and the second high-strength layer 500 may be adhered to each other without using the second adhesive layer 602.

The hard coating layer 700 is positioned on the first damping layer 200 in the front surface 101 of the rollable display panel 100. The hard coating layer 700 may be coated on a surface of the first damping layer 200. The hard coating layer 700 may protect the first damping layer 200 from external interference.

The black coating layer 800 is positioned on the second damping layer 300 in the rear surface 102 of the rollable display panel 100. The black coating layer 800 may be coated on a surface of the second damping layer 300. The black coating layer 800 may serve as a blowing agent including a polymer for protecting the rollable display device 1000 against an external impact.

As such, in the rollable display device 1000 according to the present exemplary embodiment, the first damping layer 200 having the shear thickening characteristic is positioned on the front surface 101 of the rollable display panel 100 which is easily bent by external stress, and the second damping layer 300 having the shear thickening characteristic is positioned on the rear surface 102 of the rollable display panel 100. Accordingly, when an external impact is generated in the rollable display device 1000 to deform a portion of the rollable display device 1000, portions of the first damping layer 200 and the second damping layer 300 corresponding to the deformed portion are deformed to increase the Young's modulus, and thus the first damping layer 200 and the second damping layer 300 absorb energy caused by an external impact.

In other words, it is possible to suppress breakage of the rollable display panel 100 due to the external impact by allowing the first damping layer 200 and the second damping layer 300 each having the shear thickening characteristic to absorb the energy caused by the external impact.

In addition, in the rollable display device 1000 according to the present exemplary embodiment, the first high-strength layer 400 and the second high-strength layer 500 each having a greater Young's modulus than the first damping layer 200 and the second damping layer 300 and having the shear thinning characteristic are respectively positioned between the rollable display panel 100 and the first damping layer 200 and between the rollable display panel 100 and the second damping layer 300. Accordingly, even when an external impact is generated in the rollable display device 1000, the first high-strength layer 400 and the second high-strength layer 500 reduce the degree of bending of the rollable display panel 100 positioned therebetween, and thus a tensile strain of the rollable display panel 100 is decreased, thereby suppressing the rollable display panel 100 from reaching a threshold tensile strain.

As a result, the first high-strength layer 400 and the second high-strength layer 500 each having a greater Young's modulus suppress excessive bending of the rollable display panel 100, thereby suppressing breakage of the rollable display panel 100 due to the external impact.

That is, the rollable display device 1000 according to the present exemplary embodiment includes the first high-strength layer 400 and the first damping layer 200 positioned on the front surface 101 of the rollable display panel 100 and the second high-strength layer 500 and the second damping layer 300 positioned on the rear surface 102 of the rollable display panel 100. Accordingly, when an external impact is generated in the rollable display device 1000 to deform a portion of the rollable display device 1000, the first damping layer 200 and the second damping layer 300 absorb energy caused by the external impact and the first high-strength layer 400 and the second high-strength layer 500 suppress excessive bending of the rollable display panel 100 caused by the external impact, suppressing breakage of the rollable display panel 100 due to the external impact.

Hereinafter, Experimental Example 1 and Experimental Example 2 confirming experimental effects of the rollable display device according to an exemplary embodiment are described with reference to FIG. 5A and FIG. 5B.

Figure 5A:
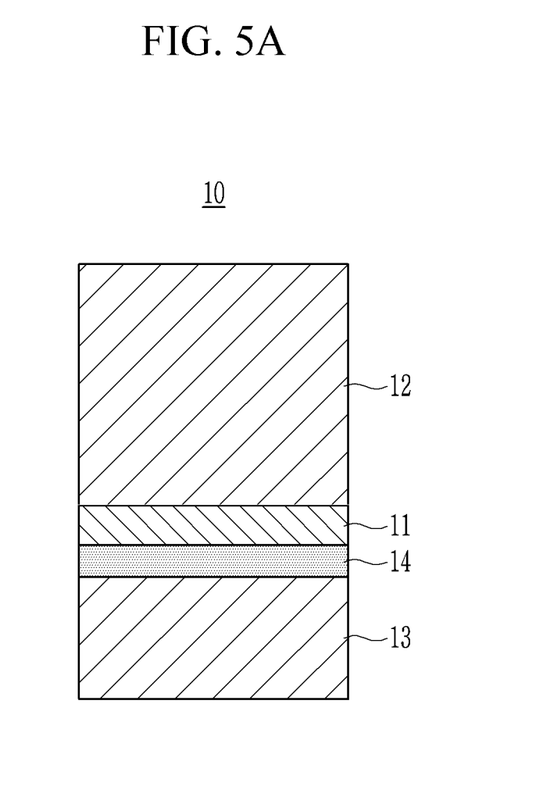
FIG. 5A is a cross-sectional view illustrating a rollable display device according to Experimental Example 1.

FIG. 5A is a cross-sectional view illustrating a rollable display device according to Experimental Example 1. FIG. 5B is a cross-sectional view illustrating a rollable display device according to Experimental Example 2.

Referring to FIG. 5A, Experimental Example 1 includes a rollable display panel 11, a first upper damping layer 12, a lower damping layer 13, and an adhesive layer 14.

The rollable display panel 11 has a predetermined thickness, the lower damping layer 13 has a thickness of 100 μm, the adhesive layer 14 has a predetermined thickness, and the first upper damping layer 12 has a thickness of 50 μm to 300 μm.

Figure 5B:
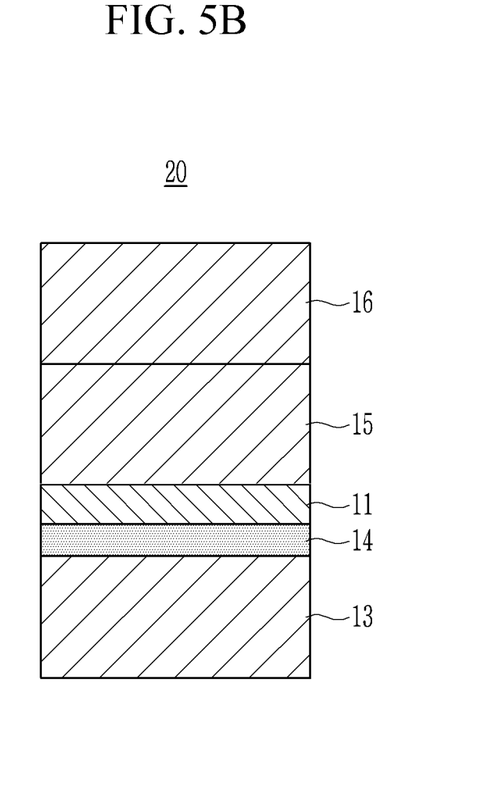
FIG. 5B is a cross-sectional view illustrating a rollable display device according to Experimental Example 2.

Referring to FIG. 5B, Experimental Example 2 includes a rollable display panel 11, a second upper damping layer 15, a third upper damping layer 16, a lower damping layer 13, and an adhesive layer 14.

The rollable display panel 11 has a predetermined thickness, the lower damping layer 13 has a thickness of 100 μm, the adhesive layer 14 has a predetermined thickness, the second upper damping layer 15 has a thickness of 25 μm to 150 μm, and the third upper damping layer 16 has a thickness of 25 μm to 150 μm.

Figure 6:
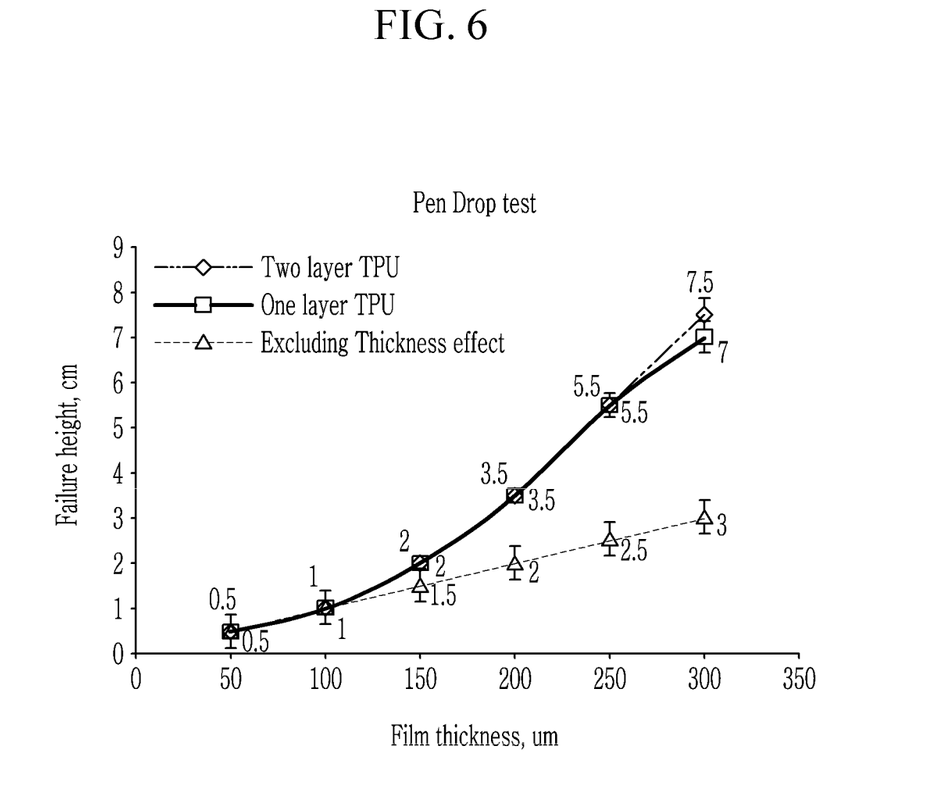
FIG. 6 is a graph illustrating experimental results of Experimental Example 1 and Experimental Example 2.

FIG. 6 is a graph illustrating experimental results of Experimental Example 1 and Experimental Example 2.

In FIG. 6, an X-axis indicates a thickness of a damping layer of a front surface of a rollable display panel, and a y-axis indicates a height at which breakage occurred in the rollable display panel in a pen drop test.

Referring to FIG. 6, the pen drop test was performed for a comparative example (excluding a thickness effect) that does not include a damping layer and has a same thickness as Experimental Examples 1 and 2, Experimental Example 1 (one TPU layer), and Experimental Example 2 (two TPU layers).

In Experimental Example 1 (one TPU layer) and Experimental Example 2 (two TPU layers), the height at which breakage occurred in the rollable display panel was non-linearly increased in the pin drop test as the thickness of the damping layer positioned in a front surface of the rollable display panel was increased, as compared with the comparative example (excluding thickness effect).

As a result, it was seen that breakage of the rollable display panel against external impact was suppressed by the shear thickening characteristic of the damping layer.

Hereinafter, a rollable display device 1002 according to an exemplary embodiment will be described with reference to FIG. 7. Hereinafter, parts that are different from the above-described exemplary embodiments will be described.

Figure 7:
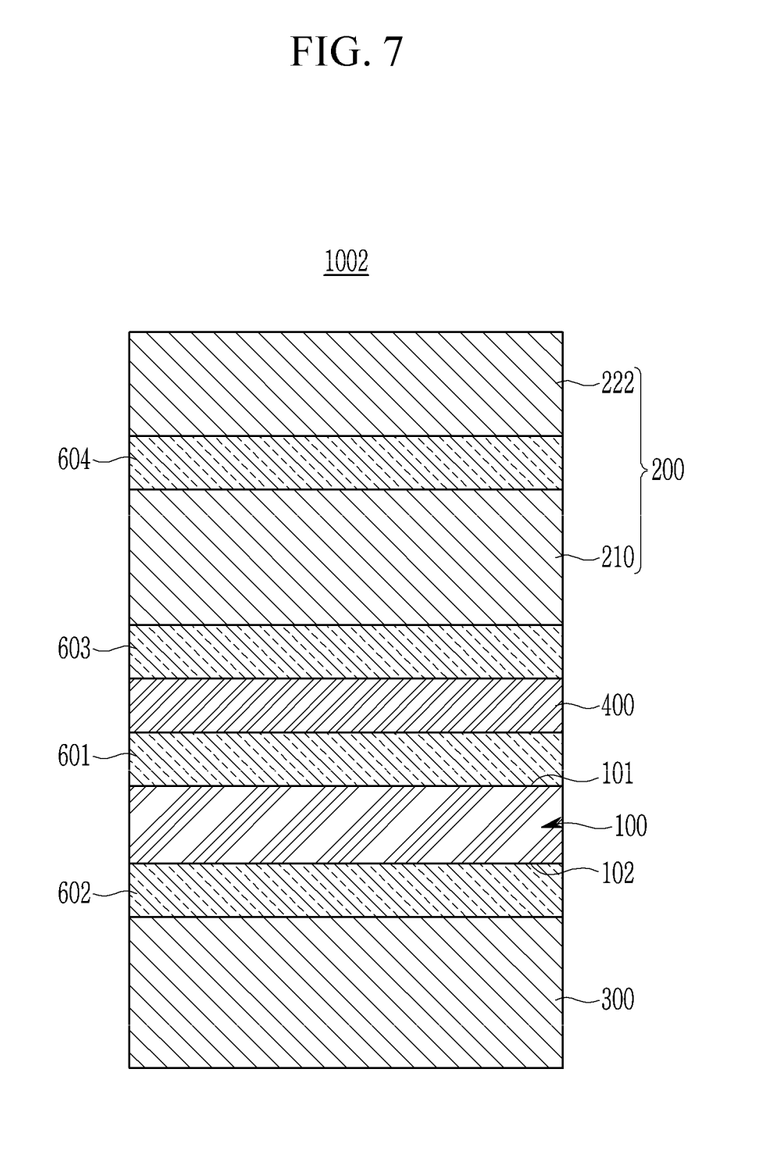
FIG. 7 is a cross-sectional view illustrating a part of a rollable display device according to an exemplary embodiment.

FIG. 7 is a cross-sectional view illustrating a part of a rollable display device according to an exemplary embodiment.

Referring to FIG. 7, the rollable display device 1002 according to the present exemplary embodiment includes a rollable display panel 100, a first damping layer 200, a second damping layer 300, a first high-strength layer 400, a first adhesive layer 601, a second adhesive layer 602, a third adhesive layer 603, and a fourth adhesive layer 604.

The first damping layer 200 includes a first sub-damping layer 210 and a second sub-damping layer 222 positioned on the front surface 101 of the rollable display panel 100.

The first sub-damping layer 210 is positioned between the third adhesive layer 603 and the fourth adhesive layer 604 on the front surface 101 of the rollable display panel 100. The first sub-damping layer 210 is thicker than the second sub-damping layer 222.

The second sub-damping layer 222 is positioned on the first sub-damping layer 210. The fourth adhesive layer 604 is positioned between the second sub-damping layer 222 and the first sub-damping layer 210.

For example, first sub-damping layer 210 may have a thickness of 100 μm, the second sub-damping layer 222 may have a thickness of 50 μm, and the second damping layer 300 may have a thickness of 100 μm.

As such, the rollable display device 1002 according to the present exemplary embodiment includes the first high-strength layer 400 and the first damping layer 200 positioned in the front surface 101 of the rollable display panel 100 and the second damping layer 300 positioned in the rear surface 102 of the rollable display panel 100. Accordingly, when an external impact is generated in the rollable display device 1002 to deform a portion of the rollable display device 1000, the first damping layer 200 and the second damping layer 300 absorb energy caused by the external impact and the first high-strength layer 400 and the second high-strength layer 500 suppress excessive bending of the rollable display panel 100 caused by the external impact, thereby suppressing breakage of the rollable display panel 100 due to the external impact.

Hereinafter, a rollable display device 1003 according to an exemplary embodiment will be described with reference to FIG. 8. Hereinafter, parts that are different from the above-described exemplary embodiments will be described.

Figure 8:
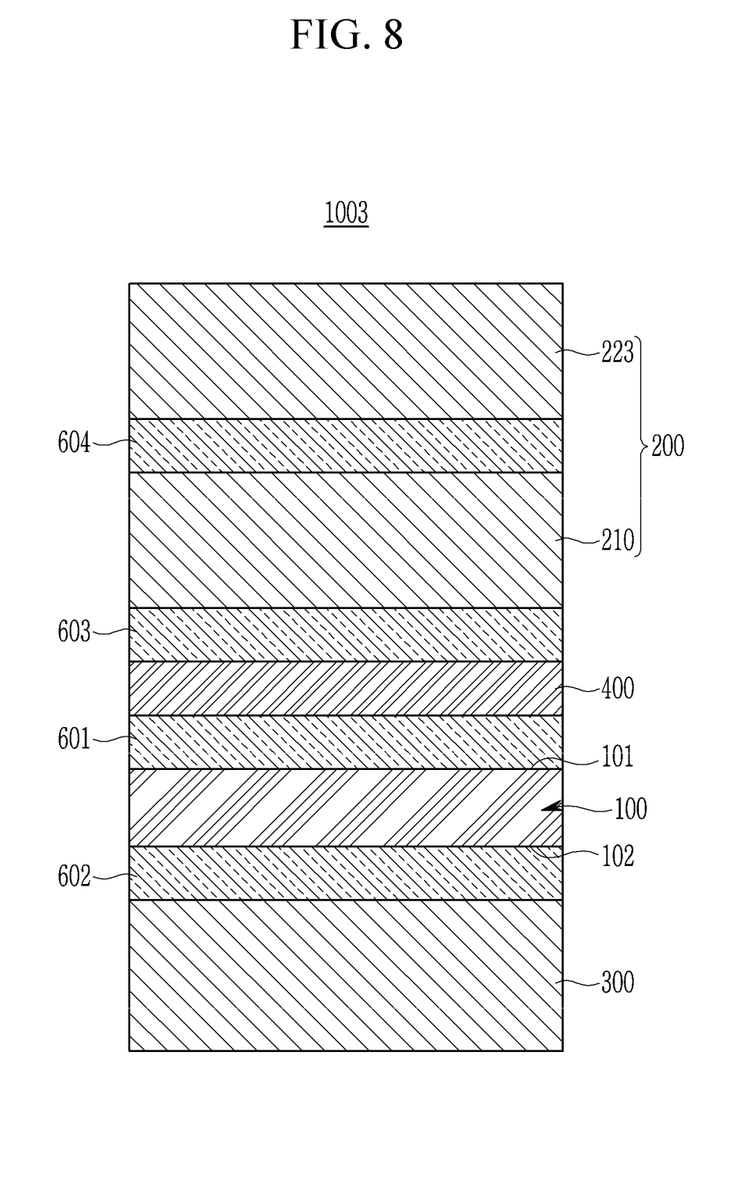
FIG. 8 is a cross-sectional view illustrating a part of a rollable display device according to an exemplary embodiment.

FIG. 8 is a cross-sectional view illustrating a part of a rollable display device according to an exemplary embodiment.

Referring to FIG. 8, the rollable display device 1003 according to the present exemplary embodiment includes a rollable display panel 100, a first damping layer 200, a second damping layer 300, a first high-strength layer 400, a first adhesive layer 601, a second adhesive layer 602, a third adhesive layer 603, and a fourth adhesive layer 604.

The first damping layer 200 includes a first sub-damping layer 210 and a third sub-damping layer 223 positioned on the front surface 101 of the rollable display panel 100. The third sub-damping layer 223 may serve as the second sub-damping layer.

The first sub-damping layer 210 is positioned between the third adhesive layer 603 and the fourth adhesive layer 604 on the front surface 101 of the rollable display panel 100. The first sub-damping layer 210 has a same thickness as the third sub-damping layer 223.

The third sub-damping layer 223 is positioned on the first sub-damping layer 210. The fourth adhesive layer 604 is positioned between the third sub-damping layer 223 and the first sub-damping layer 210.

For example, first sub-damping layer 210 may have a thickness of 100 μm, the third sub-damping layer 223 may have a thickness of 100 μm, and the second damping layer 300 may have a thickness of 100 μm.

Alternatively, the first sub-damping layer 210 may have a thickness of 150 μm, the third sub-damping layer 223 may have a thickness of 150 μm, and the second damping layer 300 may have a thickness of 100 μm.

As such, the rollable display device 1003 according to the present exemplary embodiment includes the first high-strength layer 400 and the first damping layer 200 positioned in the front surface 101 of the rollable display panel 100 and the second damping layer 300 positioned in the rear surface 102 of the rollable display panel 100. Accordingly, when an external impact is generated in the rollable display device 1003 to deform a portion of the rollable display device 1000, the first damping layer 200 and the second damping layer 300 absorb energy caused by the external impact and the first high-strength layer 400 and the second high-strength layer 500 suppress excessive bending of the rollable display panel 100 caused by the external impact, thereby suppressing breakage of the rollable display panel 100 due to the external impact Hereinafter, a rollable display device 1004 according to an exemplary embodiment will be described with reference to FIG. 9. Hereinafter, parts that are different from the above-described exemplary embodiments will be described.

Figure 9:
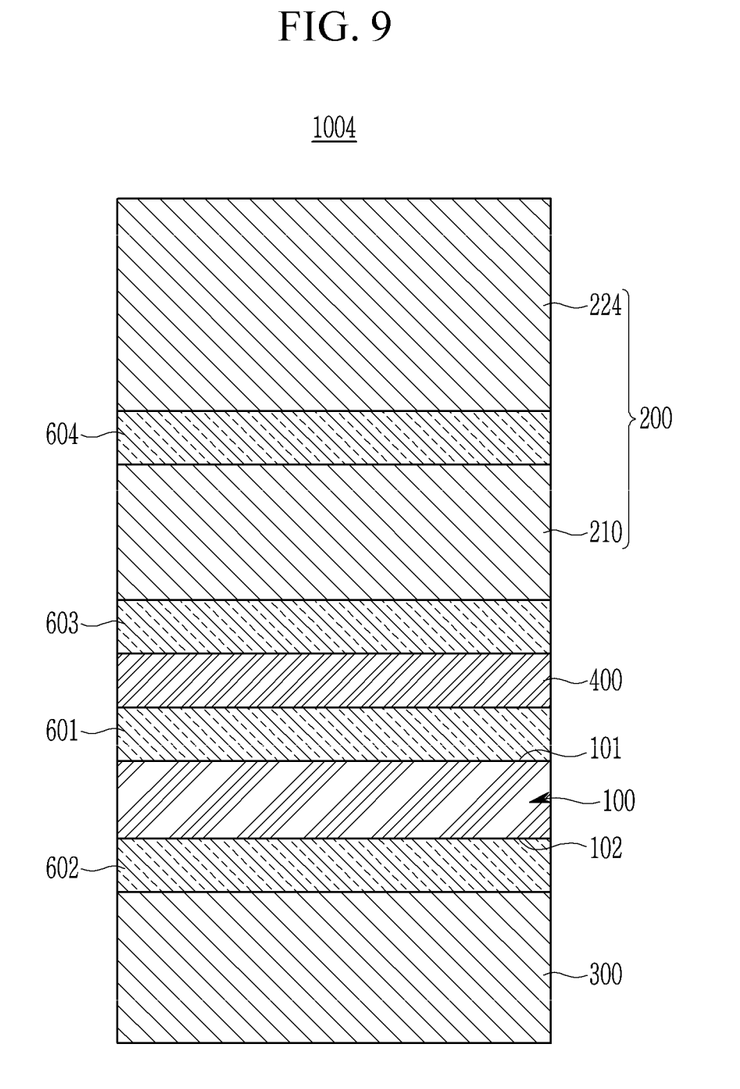
FIG. 9 is a cross-sectional view illustrating a part of a rollable display device according to an exemplary embodiment.

FIG. 9 is a cross-sectional view illustrating a part of a rollable display device according to an exemplary embodiment.

Referring to FIG. 9, the rollable display device 1004 according to the present exemplary embodiment includes a rollable display panel 100, a first damping layer 200, a second damping layer 300, a first high-strength layer 400, a first adhesive layer 601, a second adhesive layer 602, a third adhesive layer 603, and a fourth adhesive layer 604.

The first damping layer 200 includes a first sub-damping layer 210 and a fourth sub-damping layer 224 positioned on the front surface 101 of the rollable display panel 100. The fourth sub-damping layer 224 may serve as the second sub-damping layer.

The first sub-damping layer 210 is positioned between the third adhesive layer 603 and the fourth adhesive layer 604 on the front surface 101 of the rollable display panel 100. The fourth sub-damping layer 224 is thicker than the first sub-damping layer 210.

The fourth sub-damping layer 224 is positioned on the first sub-damping layer 210. The fourth adhesive layer 604 is positioned between the fourth sub-damping layer 224 and the first sub-damping layer 210.

For example, first sub-damping layer 210 may have a thickness of 100 μm, the fourth sub-damping layer 224 may have a thickness of 150 μm, and the second damping layer 300 may have a thickness of 100 μm.

As such, the rollable display device 1004 according to the present exemplary embodiment includes the first high-strength layer 400 and the first damping layer 200 positioned in the front surface 101 of the rollable display panel 100 and the second damping layer 300 positioned in the rear surface 102 of the rollable display panel 100. Accordingly, when an external impact is generated in the rollable display device 1004 to deform a portion of the rollable display device 1000, the first damping layer 200 and the second damping layer 300 absorb energy caused by the external impact and the first high-strength layer 400 and the second high-strength layer 500 suppress excessive bending of the rollable display panel 100 caused by the external impact, thereby suppressing breakage of the rollable display panel 100 due to the external impact Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A rollable display device comprising:
   a rollable display panel comprising a front surface and a rear surface;
   a first damping layer positioned on the front surface of the rollable display panel; and
   a second damping layer positioned on the rear surface of the rollable display panel,
   wherein the first damping layer and the second damping layer each have a shear thickening characteristic, and
   wherein the first damping layer comprises:
      a first sub-damping layer positioned on the front surface of the rollable display panel; and
      a second sub-damping layer positioned on the first sub-damping layer.

2. The rollable display device of claim 1, further comprising a first high-strength layer positioned between the rollable display panel and the first damping layer to have a greater Young's modulus than the first damping layer.

3. The rollable display device of claim 2, further comprising a second high-strength layer positioned between the rollable display panel and the second damping layer to have a greater Young's modulus than the second damping layer.

4. The rollable display device of claim 3, wherein:
   the first damping layer has a Young's modulus of 10 MPa to 100 MPa, and
   the second damping layer has a Young's modulus of 10 MPa to 100 MPa.

5. The rollable display device of claim 3, wherein:
   the first high-strength layer has a Young's modulus of 1 GPa to 100 GPa, and
   the second high-strength layer has a Young's modulus of 1 GPa to 100 GPa.

6. The rollable display device of claim 3, wherein:
   the first damping layer is thicker than the first high-strength layer, and
   the second damping layer is thicker than the second high-strength layer.

7. The rollable display device of claim 6, wherein:
   a thickness of the first damping layer is in a range of 5 μm to 300 μm, and
   a thickness of the second damping layer is in a range of 5 μm to 300 μm.

8. The rollable display device of claim 6, wherein:
a thickness of the first high-strength layer is in a range of 10 μm to 50 μm, and
a thickness of the second high-strength layer is in a range of 10 μm to 50 μm.

9. The rollable display device of claim 3, wherein the first high-strength layer and the second high-strength layer each have a shear thinning characteristic.

10. The rollable display device of claim 9, wherein:
the first high-strength layer comprises polyimide, and
the second high-strength layer comprises polyimide.

11. The rollable display device of claim 3, further comprising:
a first adhesive layer positioned between the rollable display panel and the first high-strength layer; and
a second adhesive layer positioned between the rollable display panel and the second high-strength layer.

12. The rollable display device of claim 1, wherein the first damping layer and the second damping layer each comprise an elastomer comprising at least one of thermoplastic urethane (TPU) and thermoplastic olefin (TPO).

13. The rollable display device of claim 1, wherein the first sub-damping layer is thicker than the second sub-damping layer.

14. The rollable display device of claim 1, wherein a thickness of the first sub-damping layer is identical to a thickness of the second sub-damping layer.

15. The rollable display device of claim 1, wherein the second sub-damping layer is thicker than the first sub-damping layer.

16. The rollable display device of claim 1, further comprising a hard coating layer positioned on the first damping layer.

17. The rollable display device of claim 1, further comprising a black coating layer positioned on the second damping layer.

18. A rollable display device comprising:
a rollable display panel comprising a front surface and a rear surface;
a first damping layer positioned on the front surface of the rollable display panel;
a second damping layer positioned on the rear surface of the rollable display panel; and
a first high-strength layer positioned between the rollable display panel and the first damping layer,
wherein a Young's modulus of the first high-strength layer is greater than that of the first damping layer, and
wherein the first damping layer comprises:
a first sub-damping layer positioned on the front surface of the rollable display panel; and
a second sub-damping layer positioned on the first sub-damping layer.

19. The rollable display device of claim 18, further comprising
a second high-strength layer positioned between the rollable display panel and the second damping layer to have a greater Young's modulus than the second damping layer.

* * * * *